United States Patent [19]

Scheuermann

[11] 4,108,107

[45] Aug. 22, 1978

[54] ROTATABLE SUBSTRATE HOLDER FOR USE IN VACUUM

[75] Inventor: Glen R. Scheuermann, Oakland, Calif.

[73] Assignee: Airco, Inc., Montvale, N.J.

[21] Appl. No.: 672,691

[22] Filed: Apr. 1, 1976

[51] Int. Cl.$^2$ .............................................. C23C 13/02
[52] U.S. Cl. .................................. 118/49.1; 118/500; 427/248 G
[58] Field of Search ................. 118/48, 49, 49.1, 49.5, 118/53, 500; 269/57; 427/248 R, 248 G, 249, 250, 251, 252, 255, 295

[56] References Cited

U.S. PATENT DOCUMENTS

| 3,019,129 | 1/1962 | Walsh | 118/49 X |
|---|---|---|---|
| 3,424,628 | 1/1969 | Winings | 118/49.5 X |
| 3,425,926 | 2/1969 | Hojyo | 118/53 X |
| 3,456,616 | 7/1969 | Gleim et al. | 118/49.5 |
| 3,530,824 | 9/1970 | Illsley | 118/48 |
| 3,656,453 | 4/1972 | Tousimis | 118/48 |
| 3,662,708 | 5/1972 | Shrader | 118/49 |
| 3,783,822 | 1/1974 | Wollam | 118/49.1 |
| 3,858,547 | 1/1975 | Bergfelt | 118/49 |
| 3,889,632 | 6/1975 | Brunner et al. | 118/49.1 |
| 3,911,162 | 10/1975 | Erhart et al. | 118/49.1 |

FOREIGN PATENT DOCUMENTS

| 79,132 | 9/1955 | Netherlands | 118/49 |

Primary Examiner—Mervin Stein
Attorney, Agent, or Firm—David A. Draegert; E. W. Bopp; L. R. Cassett

[57] ABSTRACT

A substrate or part holder is disclosed which allows rotation of at least two parts about their individual axes as well as rotation of all of the parts about a main axis. The part holder has a stub shaft for receiving each part, and a hollow housing attached to the end of a hollow shaft. An interior shaft is rotatable inside the hollow shaft and a central gear engages a gear on each stub shaft inside of the housing. Means are provided for mounting a part on each stub shaft outside of the housing. Rotation of the hollow shaft will cause rotation of all of the parts about the common axis, while any differential in rotation between the hollow shaft and the interior shaft will cause rotation of each part about the axis of the stub shaft to which it is attached.

11 Claims, 3 Drawing Figures

ROTATABLE SUBSTRATE HOLDER FOR USE IN VACUUM

BACKGROUND OF THE INVENTION

1. Field of the Invention

This invention is a rotatable device for holding at least two substrates, such as turbine engine parts, whereby each substrate may also be rotated about its individual axis during a high temperature vacuum coating process.

2. Brief Description of the Prior Art

In coating turbine parts, it is desirable to control the thickness distribution of the deposited coating. The desired distribution may be uniform or variable over the surface of the parts. One way in which the distribution may be controlled is by proper positioning of the part with respect to the coating source. In particular, the part can be held at an angle to the path of the coating material so that more material is deposited at one end than at the other.

Previously, it was known to mount a number of turbine parts on a holder at the end of a main shaft which extended through a load lock into a vacuum chamber. Each part was mounted on a stub at an angle, e.g., 20°, with respect to the main shaft. The main shaft was rotated about its longitudinal axis so that each part was exposed equally to the coating source. However, in order to obtain the desired thickness distribution, it was necessary to periodically remove the holder and the parts from the vacuum chamber and manually turn the parts 180° about their mounting stub on the holder.

Periodic removal of the parts during the coating process has several distinct disadvantages. First, removal extends the processing time because of the time required to cool and reheat the parts, and vent and re-evacuate the load lock. Second, additional manual labor was required to demount, rotate, and remount the parts on the holder. Third, and most important, cooling and exposure of a partially coated part to the atmosphere causes an interface in the coating layer which may have significant detrimental effects in the life time and other performance characteristics of the coating. Despite the practical disadvantages of periodically removing the parts during the coating process, this procedure was followed for several years because it was believed impractical to rotate the parts with respect to the holder while in the coating position. It must be remembered that the turbine engine parts are typically coated at temperatures exceeding 800° C in vacuum lower than $10^{-4}$ Torr. Under such conditions contacting metal surfaces tend to seize and lubricants which might contaminate the coating must be avoided. Further, the coating material tends to quickly clog and foul exposed moving parts.

SUMMARY OF THE INVENTION

The method and apparatus of the present invention relate to a holder for two or more parts to be coated in a vacuum process. The holder is mounted so that all the parts may be rotated together about a main axis. Means are provided whereby each part may also be rotated about an individual axis. Further, means are provided for remotely controlling the individual axis rotation independently of the main axis rotation.

The preferred embodiment comprises a hollow housing fixed to an end of a hollow supporting shaft. The housing has bearings for supporting two or more stub shafts with the axis of each stub shaft disposed at a desired angle to the axis of the hollow shaft. A drive shaft is disposed within the hollow shaft and extends into the housing. Preferably, a central gear attached to the interior shaft meshes with gears affixed to the stub shafts. The stub shafts extend outwardly from the housing and means are preferably provided at the exposed ends of the stub shafts for mounting parts or substrates thereon. The interior shaft is independently rotatable so that, if there is a differential rotation between the interior shaft and the hollow shaft, the stub shafts will rotate about their individual axes. With this mechanism, the substrates may be rotated as a group about the main axis and they may also be rotated either continuously or intermittently about their individual axes.

The design and the construction materials are chosen to enable use of the holder in the severe environment encountered in a high-temperature, high-vacuum coating process. The gears and bearings are all located inside the housing where they are effectively shielded from the coating material.

Use of the holder aids in attaining a coating having a desired thickness distribution, such as a graduated thickness along the axis of a part while maintaining uniformity of coating thickness around its circumference or periphery.

DETAILED DESCRIPTION OF A PREFERRED EMBODIMENT

Figure 2:
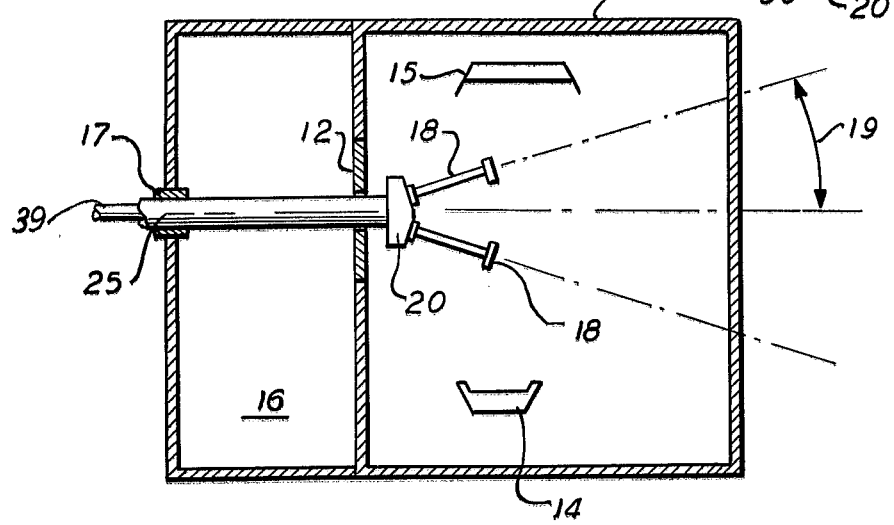
FIG. 2 is a schematic representation illustrating the use of a substrate holder in a vacuum coating chamber.

Numerous variations of vacuum coating systems are known in the art. As illustrated schematically in FIG. 2, a typical system has a chamber 10, a coating source 14, a substrate heater 15, and an evacuation means (not shown). Usually, a door 12 and a load lock 16 are provided so that the chamber 10 is maintained under vacuum while substrates are loaded or unloaded. A main shaft 25 extends across the load lock 16 and through a seal 17 to a conventional driving mechanism (not shown), which can rotate the shaft as well as withdraw it from chamber 10 into load lock 16.

Preferably, several substrates such as turbine parts 18, are coated simultaneously in order to achieve utilization of space and time. A multiplicity of substrates 18 are mounted on a holder 20, which is fixed to an end of main shaft 25. The angle 19 which the individual axis of each substrate 18 makes with the main shaft 25 is chosen so as to obtain the desired distribution of coating material along the axis of the substrate. In order to insure the desired distribution of coating material around the circumference or periphery of a substrate, it is necessary to rotate it about its individual axis.

Figure 1:
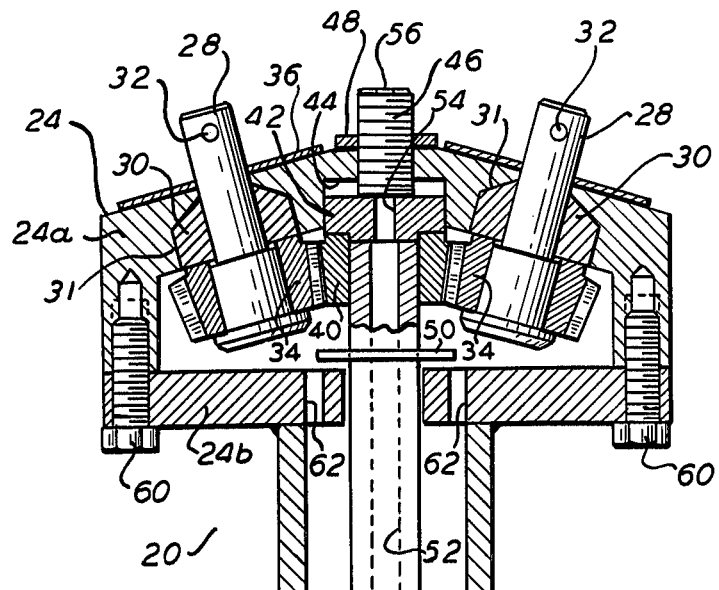
FIG. 1 is a sectional view of a preferred embodiment of the substrate holder of this invention.

The holder illustrated in FIG. 1 enables each substrate to be rotated at its individual axis desired, as the holder 20 has a hollow housing 24 which is conveniently formed from two parts, walls 24a and 24b, held together by bolts 60. Wall 24b is welded to one end of a hollow shaft 26. A quick disconnect means (not shown) is provided for attaching the other end of hollow shaft 26 to the end of main shaft 25. An interior shaft 38 is concentrically mounted for rotation inside hollow shaft 26. One end of interior shaft 38 extends into housing 24 through an opening in wall 24b. The other end of interior shaft 38 has a tongue 58 which engages a shaft 39 mounted for rotation inside main shaft 25. Conventional means are used for rotating shaft 39 independently of main shaft 25.

Figure 3:
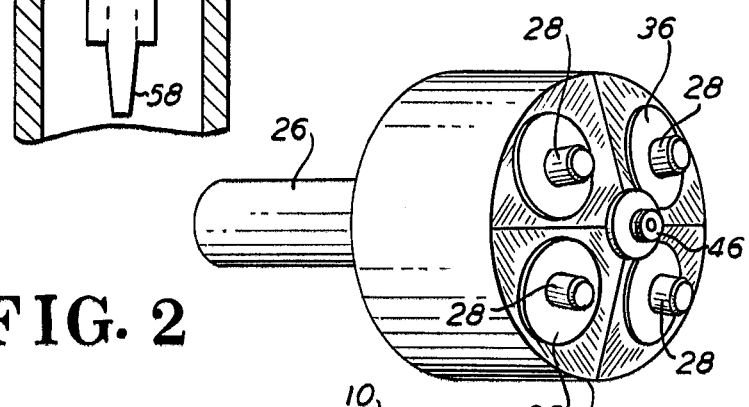
FIG. 3 is a perspective view of a substrate holder for mounting four substrates.

A stub shaft 28 is provided for mounting each substrate. In the preferred embodiment, shown in FIG. 3, four stub shafts are mounted symetrically about the main axis of hollow shaft 26. One end of each stub shaft 28 is provided with means to receive and to hold a substrate. Preferably, stub shaft 28 is provided with a hole 32 for receiving a pin which may be inserted to secure a substrate or a substrate adapter to the stub shaft 28. A thrust washer 36 is placed around stub shaft 28 and between the wall 24a and the substrate or adapter in order to assist in bearing the load of a substrate. Each stub shaft extends into housing 24 and passes through a recess 31 in bearing 30 mounted in wall 24a. If desired, an additional bearing may be mounted in wall 24b. A gear 34 is mounted on each stub shaft, and a central gear 40 is fixed to interior shaft 38 so as to engage each of the gears 34. When each stub shaft 28 is mounted at angle, typically 10° to 45°, to the axis of the interior shaft 38, it is preferred that each of gears 34 and 40 be conical. The engagement of the gears is adjustable by means of a lock nut 48 and a set screw 46 which extends through the wall 24a. The set screw positions an end bearing 42 which is mounted in recess 44 in the wall 24a and which restrains the end of interior shaft 38. A washer or plate 50 is preferably affixed to the interior shaft 38 inside of the housing 24 to limit the possible travel of the interior shaft 38 along its axis. If desired, interior shaft 38, bearing 42, and set screw 46 may have a channel or hole 52, 54, and 56 respectively, for the insertion of a thermocouple or other sensing device along the main axis.

Preferably, housing wall 24b is provided with a number of openings 62 which provide communication between the interior of housing 24 and the interior of hollow shaft 26. Holes 62 insure that any gases which may be inside of head 24 may be evacuated through hollow shaft 26 rather than leaking past the bearings 30 and 42 in the direction of the coating process.

Housing 24 and hollow shaft 26 may be 304 stainless steel although a material such as HASTELLOY B alloy that will withstand the high-temperature environment of the coating process better, is preferred. The gears 34 and 40, the stub shaft 30, and the interior shaft 38 must be of a material, such as HASTELLOY B alloy, which has high strength at the operating temperature. Further, the gear teeth must be relatively large in order not to bend under load; a dimetral pitch of 16 is preferred. Gears of 316 stainless steel and a dimetral pitch of 24 were bent during approximately 100 hours of operation in which the housing temperatures approached 1000° C.

In order to prevent binding at both room and operating temperatures, the bearings 30 are preferably molybdenum, graphite, or other material which has a thermal expansion coefficient significantly less than that of the material of stub shaft 28. The various parts are dimensioned such that at room temperature shaft 28 turns inside bearing 30, which is stationary in the recess 31, while at operating temperature stub shaft 28 and bearing 30 rotate together inside recess 31. Such construction is useful because the loading forces are then distributed over a much larger bearing surface at operating temperature where the materials are more prone to deform. The required dimensions and clearances of the arts can be readily calculated from their relative thermal expansion coefficients.

End bearing 42 is preferably molybdenum so that relative thermal expansion of the parts will tend to free rather than restrict the bearing.

In order to prevent seizing of shaft, bearing, and gear surfaces, all the parts are preferably coated with a low vapor pressure, anti-seizing compound, such as molybdenum disulfide, tungsten disulfide, or boron nitride, before assembly. Molybdenum disulfide is particularly preferred because it can be applied with an aerosol spray.

The use of materials which will maintain their strength at the operating temperatures is preferred because the need for special cooling of the holder is eliminated. Water cooling of parts, especially rotating parts, is particularly disadvantageous in vacuum because of problems with leaks.

The number of stub shafts and the angles of displacement of the stub shafts 28 will depend upon the nature of the coating source and the requirements of the particular coating desired. As illustrated, the central axis of holder 20 is coaxial with the main axis of shaft 25. However, in some cases holder 20 may be mounted at an angle provided that appropriate means are included so that hollow shaft 26 and interior shaft 38 are rotatable as desired.

In a typical application, holder 20 is placed in load lock 16 and attached to main shaft 25. With load lock 16 open, and chamber door 12 closed, substrates 18 are mounted on the ends of stub shafts 28 and locked in place by means of pins inserted in holes 32. The load lock 16 is closed, door 12 is opened, and the substrates and holder are moved into the vacuum chamber 10. In one method of use, both the hollow shaft and the interior shaft 38 are rotated together thus rotating the housing and all of the substrates about the main axis. After a period of coating, interior shaft 38 is rotated with respect to hollow shaft 26 so that each substrate is turned 180° about its individual axis. The coating process is continued with the hollow shaft 26 and the interior shaft 38 rotating together as before. Thus, each substrate receives a uniform coating of material around its circumference. It should be apparent that both the hollow shaft 26 and the interior shaft 38 may be turned continuously but at different rates or in different directions throughout the entire process.

After the substrates are coated as desired and the holder and substrates are withdrawn into load lock 16, the door 12 is closed, lock 16 is vented to atmosphere and opened so that the substrates may be removed from the stub shafts 28. Several load locks and substrate holders may be provided for a single coating chamber so that one set of substrates is being coated at all times while other sets of substrates are being loaded or unloaded.

Numerous variations and embodiments of this invention may be conceived by those skilled in the art and therefore it should be understood that the above description is for purposes of illustration and it is not intended to limit the scope of the invention as claimed.

What is claimed is:

1. A holder for supporting and rotating at least two substrates in the vicinity of a coating source inside a vacuum chamber, comprising:
   (a) a hollow support shaft for supporting the substrates for rotation about a main axis;

(b) a stub shaft for supporting each substrate for rotation about an individual axis;
(c) a means fixed to the support shaft for rotatably mounting each stub shaft;
(d) a drive shaft inside the support shaft and independently rotatable with respect to the support shaft;
(e) a gear fixed to each stub shaft;
(f) a central gear fixed to the drive shaft and engaging each stub shaft gear for rotating each stub shaft about its individual axis as the drive shaft is rotated with respect to the support shaft; and
(g) a housing for shielding each gear from the coating source wherein the housing has an opening for allowing gas to pass between the inside of the housing and the interior of the support shaft.

2. The holder of claim 1 which is constructed of materials which maintain their strength at operating temperatures above 800° C.

3. The holder of claim 2 further comprising means outside the chamber for independently controlling the support shaft rotation and the drive shaft rotation.

4. The holder of claim 2 wherein the stub shaft mounting means comprises a bearing for each stub shaft, each stub shaft passes through its bearing, each stub shaft has a coefficient of thermal expansion larger than its bearing, and each stub shaft and its bearing are dimensioned such that the stub shaft turns inside the bearing at room temperature but the stub shaft rotates with the bearing at operating temperature.

5. The holder of claim 4 wherein each bearing is molybdenum or graphite.

6. The holder of claim 2 wherein the stub shafts and gears are coated with an anti-seizing compound, selected from the group consisting of molybdenum disulfide, tungsten disulfide, and boron nitride.

7. The holder of claim 2 wherein the drive shaft, each stub shaft, and each gear are HASTELLOY B alloy.

8. The holder of claim 7 wherein the housing is HASTELLOY B alloy.

9. The holder of claim 8 wherein the stub shaft mounting means comprises a bearing for each stub shaft and each bearing is molybdenum.

10. The holder of claim 2 wherein each stub shaft is supported at an angle to the support shaft of between 10° and 45°.

11. In an electron beam coating apparatus for the simultaneous vacuum vapor deposition coating of a multiplicity of turbine blades or vanes with a corrosion resistant alloy which apparatus includes an evacuable chamber, a load-lock adjacent the chamber, means inside the chamber for receiving the alloy to be deposited on said blades or vanes, electron beam heating means for vaporizing said alloy to form a vapor cloud of the same, and substrate holder means for supporting said blades or vanes in said vapor cloud, wherein the improvement comprises:
a hollow support shaft for rotating said substrate holder means about a first axis;
a stub shaft associated with said substrate holder means for rotating each such blade or vane about a separate axis during the coating operation;
means fixed to the support shaft for rotatably mounting each stub shaft at an angle to the first axis of between 10° and 45°;
a drive shaft inside and coaxial with the support shaft for controlling the separate axis rotation independently of the first axis rotation during the coating operation;
a gear fixed to each stub shaft;
a central gear fixed to the drive shaft and engaging each stub shaft gear for rotating each stub shaft about its separate axis as the drive shaft is rotated with respect to the support shaft; and
a housing for shielding each gear from the coating source wherein the housing has an opening for allowing gas to pass between the inside of the housing and the interior of the support shaft,
whereby said blades or vanes can be coated to a predetermined thickness without any interfaces in the coating.

* * * * *